United States Patent [19]

Varadarajan et al.

[11] Patent Number: 4,605,864

[45] Date of Patent: Aug. 12, 1986

[54] AFL (ADVANCED FAST LOGIC) LINE DRIVER CIRCUIT

[75] Inventors: Hemmige D. Varadarajan, Sunnyvale; Nader Vasseghi, Mountain View, both of Calif.

[73] Assignee: Advanced Micro Devices, Inc., Sunnyvale, Calif.

[21] Appl. No.: 688,719

[22] Filed: Jan. 4, 1985

[51] Int. Cl.[4] ............... H03K 19/092; H03K 19/01; H03K 17/04; H03K 17/60
[52] U.S. Cl. ..................... 307/270; 307/443; 307/454; 307/475; 307/561; 307/246; 307/300
[58] Field of Search ............... 307/443, 446, 454–458, 307/475, 270, 280, 300, 549, 551, 559, 561, 567, 246

[56] References Cited

U.S. PATENT DOCUMENTS

| 3,482,111 | 12/1969 | Gunderson et al. ............ 307/443 X |
| 3,694,665 | 9/1972 | Belluche ............................. 307/443 |
| 4,409,498 | 10/1983 | Dorler et al. .................. 307/475 X |
| 4,471,237 | 9/1984 | Kaplan ............................. 307/443 |
| 4,531,067 | 7/1985 | Banker et al. ................ 307/443 X |
| 4,536,664 | 8/1985 | Martin ............................. 307/475 |
| 4,538,075 | 8/1985 | Varadarajan .................... 307/454 |

FOREIGN PATENT DOCUMENTS 0054408  6/1982  European Pat. Off. ............ 307/456

Primary Examiner—Larry N. Anagnos
Attorney, Agent, or Firm—Patrick T. King; Davis Chin; J. Vincent Tortolano

[57] ABSTRACT

A line driver circuit is formed of a driver circuit section and a receiver circuit section. The driver circuit section provide a low impedance drive for charging and discharging quickly a capacitive load. A receiver circuit section includes an output level-shifting transistor which is adapted for translating a voltage at an output node of the driver circuit section to a compatible higher level.

16 Claims, 2 Drawing Figures

DRIVER                     RECEIVER

AFL (ADVANCED FAST LOGIC) LINE DRIVER CIRCUIT

DESCRIPTION

Background of the Invention

This invention relates generally to high speed gate circuits and more particularly, it relates to an AFL (Advanced Fast Logic) gate driver circuit adapted for driving large capacitive loads.

As is generally known, when an AFL gate circuit is used to drive line loads having large capacitance, there will be a significant increase in the propagation delay time as the load capacitance of the output line increases. Thus, this gate propagation delay will have an impact on degrading the high performance in such gate circuits. A standard AFL gate circuit of the prior art is shown in FIG. 1 and has been designated "Prior Art". With a load capacitance of 5 pF, the average propagation delay time was found to be approximately 9.45 ns. The gate circuit of FIG. 1 will be discussed more fully hereinafter.

It would therefore be desirable to provide an AFL gate driver circuit for driving large capacitive lines which still possesses a high speed of operation and has relatively low power consumption. The gate driver circuit of the present invention was found to possess an average propagation delay time of only 2.60 ns.

SUMMARY OF THE INVENTION

Accordingly, it is a general object of the present invention to provide an AFL gate driver circuit for driving large capacitive lines, but yet still possesses a high speed of operation and has relatively low power consumption.

It is an object of the present invention to provide an AFL line driver circuit formed of a driver circuit section and a receiver circuit section for driving large capacitive lines which produces a relatively low propagation delay time.

It is another object of the present invention to provide an AFL gate driver circuit formed of a driver circuit section and a receiver circuit section wherein the driver circuit section possesses relatively large current source and current sink capabilities for charging and discharging quickly a load capacitance.

It is still another object of the present invention to provide an AFL line driver circuit formed of a driver circuit section and receiver circuit section wherein the receiver circuit section produces output voltage levels compatible with other AFL gate circuits.

In accordance with these aims and objectives, the instant invention is concerned with the provision of a line driver circuit formed of a driver circuit section and a receiver circuit section. The driver circuit section includes a current source and a current sink which is adapted for charging and discharging quickly a load capacitance. The current source is formed of a first bipolar transistor. The first transistor has its base coupled to an input terminal, its collector coupled to a supply potential via a first resistor and its emitter coupled to the capacitive load and to an output driver section node. The current sink is formed of a Schottky transistor. The Schottky transistor has its base coupled to the supply potentital via the first resistor and a second resistor, its emitter coupled to a ground potential and its collector coupled to the capacitive load. The receiver circuit section includes an output level-shifting transistor which translates a voltage at the output node of the driver circuit section to a higher level. The output transistor is formed of a second bipolar transistor which has its emitter coupled to the output node of the driver circuit section and has its collector coupled to an output terminal.

BRIEF DESCRIPTION OF THE DRAWINGS

These and other objects and advantages of the present invention will become more fully apparent from the following detailed description when read in conjunction with the accompanying drawings with like reference numerals indicating coresponding parts throughout, wherein.

DESCRIPTION OF THE PREFERRED EMBODIMENT

Figure 1:
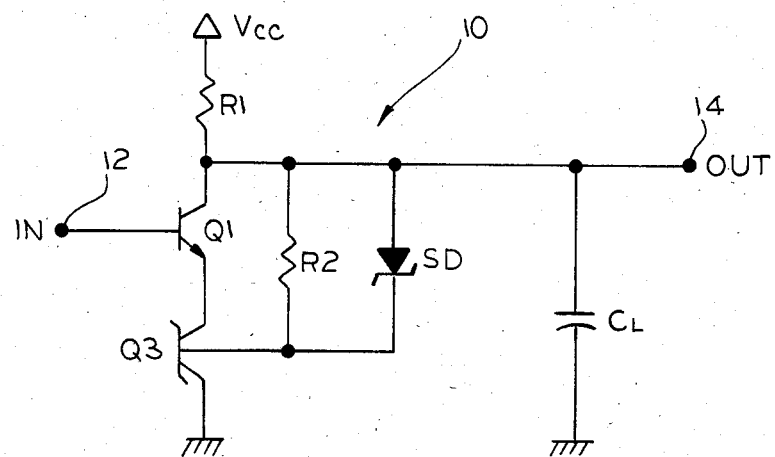
FIG. 1 shows a standard AFL line driver circuit of the prior art.

Referring now in detail to the various views of the drawings, there is shown in FIG. 1 a standard AFL (Advanced Fast Logic) gate drive circuit 10 of the prior art. The driver circuit 10 includes an input terminal 12 for receiving an input logic signal. The input terminal 12 is connected to the base of an NPN-type bipolar transistor Q1. The collector of the transistor Q1 is connected to a supply voltage or potential $V_{CC}$ via a resistor R1. The supply potential $V_{CC}$ is usually in the range of 2.0 to 2.4 volts and is presently made to be operated at 2.0 volts. The emitter of the transistor Q1 is connected to the collector of a Schottky diode-clamped transistor or Schottky transistor Q3, which has a Schottky diode connected from the base therein to the collector (the cathode of a diode being connected to the collector) to maintain the transistor out of saturation so as to increase its switching speed. The collector of the transistor Q1 is also coupled to one end of a resistor R2, and the other end of the resistor R2 is tied to the base of the Schottky transistor Q3. The emitter of the transistor Q3 is tied to a ground potential gnd. A Schottky barrier diode SD has its anode connected to the collector of the transistor Q1 and its cathode connected to the base of the transistor Q3.

The collector of the transistor Q1 is further connected to an output terminal 14 which is, in turn, connected to one end of a load capacitance represented by $C_L$. The other end of the load capacitance $C_L$ is tied to the ground potential. When a high or up level of the input logic signal is being applied to the input terminal 12 (wherein the output terminal 14 is experiencing a high-to-low transition), the base-to-emitter potential of the transistor Q1 is sufficiently high so as to maintain it in a conductive or "on" state. Therefore, the load capacitance $C_L$ is discharged through the path of the transistors Q1 and Q3. On the other hand, with a low or down level of the input logic signal being applied to the input terminal 12 (wherein the output terminal 14 is experiencing a low-to-high transition), the base-to-emitter potential of the transistor Q1 is sufficiently low so as to render it in the non-conductive or "off" state. Consequently, the transistor Q3 is turned off and as a result, the load capacitance $C_L$ is charged up through the resistor R1. If the load capacitance $C_L$ is large, the propagation delay time is significant due to the charging time required during a low-to-high transition on the output terminal 14. With $V_{CC}=2.0$ volts, $C_L=5.0$ pF, $R1=10k$ and $R2=20k$ and the operating temperature of $T=25°$ C., a computer simulation yielded an output high-to-low transition propagation delay time $T_{p+-}$ of 5.4 ns and an output low-to-high transition propagation delay time $T_{p-+}$ of 13.5 ns. Thus, an average propagation delay time $T_{pav}$ was found to be 9.45 ns.

In order to reduce the propagation delay time, the current sink and current source capabilities of the standard AFL gate circuit can be increased by decreasing the values of the resistors R1 and R2. With $V_{CC}=2.0$ volts, $C_L=5.0$ pF, $R1=2.5k$ and $R2=5k$, a simulation yielding comparative data of the corresponding propagation delay times is shown in Table I below for the various temperatures.

TABLE I

| Temperature | $T_{p+-}$ | $T_{p-+}$ | $T_{pav}$ | Power |
| --- | --- | --- | --- | --- |
| 25° C. | 2.77 ns | 4.42 ns | 3.60 ns | 675 uw |
| 155° C. | 4.00 ns | 7.00 ns | 5.50 ns | 652 uw |
| −55° C. | 3.32 ns | 3.32 ns | 5.60 ns | 600 uw |

Figure 2:
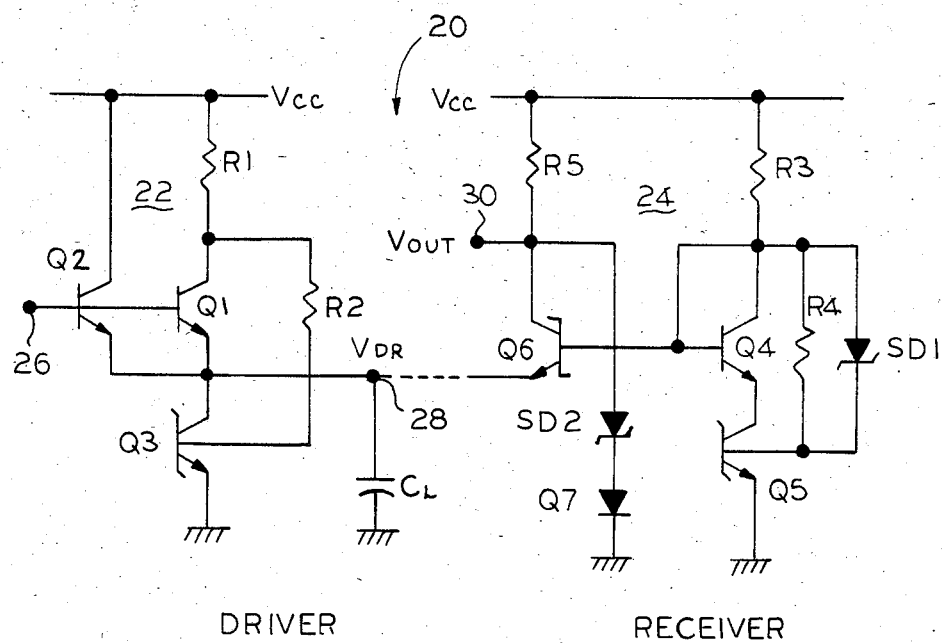
FIG. 2 shows an AFL line drivr circuit constructed in accordance with the basic principles of the present invention.

In FIG. 2, there is illustrated an AFL line driver circuit 20 of the present invention which produces a superior performance over the standard AFL gate circuit of FIG. 1, even the version having the reduced resistor values. The line driver circuit 20 comprises a driver circuit section 22 and a receiver circuit section 24. The driver circuit 22 includes an input terminal 26 which is connected to the bases of NPN-type bipolar transistors Q2 and Q1. The collector of the transistors Q2 is connected to a supply potential $V_{CC}$ which is operated at typically 2.0 volts, and the collector of the transistor Q1 is connected to the supply potential via a resistor R1. The emitters of the transistors Q1 and Q2 are commonly connected and further joined to the collector of a Schottky diode-clamped transistor or Schottky transistor Q3. The collector of the transistor Q1 is also connected to one end of a resistor R2 and the other end of the resistor R2 is connected to the base of the Schottky transistor Q3. The emitter of the transistor Q3 is tied to a ground potential gnd.

The common emitters of the transistors Q1 and Q2 are coupled to an output node 28 of the driver circuit section 22. The output node 28 is connected to one end of the load capacitance $C_L$ and the other end of the load capacitance $C_L$ is connected to the ground potential gnd. The invention will be better understood by an analysis of its operation. For purposes of illustration, an input logic signal is considered to be applied to the input teminal 26 which swings between a low voltage level $V_{BE}$ which is about 0.8 volts and a high voltage level $V_{BE}+V_{SD}$ which is about 1.3 volts at room temperature. The subscript BE refers to the base-to-emitter voltage drop and the subscript SD refers to the Schottky barrier diode voltage drop during its conductive state.

Assuming now that a low or down voltage level of the input logic signal is being applied to the input terminal 26, i.e., $V_{IN}=V_{BE}=V_{LOW}$, both the transistors Q1 and Q2 will be rendered in the non-conductive or "off" state and the transistor Q3 will be in the soft saturation region where the collector-to-emitter voltage drop $V_{CE}$ will be equal to $V_{BE}-V_{SD}=V_{CE(SAT)}$. Thus, the output voltage $V_{DR}$ of the driver circuit section taken from a common emitters of the transistors Q1 and Q2 at the node 28 will be at $V_{CE(SAT)}$. With a high or up voltage level of the input logic signal being applied to the input terminal 26 (input low-to-high transition), i.e., $V_{IN}=V_{BE}+V_{SD}=V_{HI}$, both of the transistors Q1 and Q2 will be rendered in the conductive or "on" state so as to provide a low impedance from the supply potential $V_{CC}$ thereby permitting a current to charge up quickly the load capacitors $C_L$ to the value of $V_{IN}-V_{BE}$ or $V_{SD}$. Therefore, the output voltage $V_{DR}$ at the node 28 will now be equal to $V_{SD}$. On the other hand, with an input high-to-low transition, both the transistors Q1 and Q2 will be turned off, and the load capacitance $C_L$ will be discharged quickly through the transistor Q3 when it is driven into soft saturation.

The current sinking capability of the transistor Q3 can be further improved by decreasing the value of the resistor R2. As a result, there will be more current fed to the base of the transistor Q3 so as to produce more collector current which will be available in discharging the capacitance $C_L$. With $V_{CC}=2.0$ volts, $C_L=5.0$ pF, $R1=10k$ and the operating temperature of $T=25°$ C., simulation data yielding the corresponding propagation delay times is shown in Table II below for the two values of the resistor R2.

TABLE II

| R2 | $T_{p+-}$ | $T_{p-+}$ | $T_{pav}$ | Power |
| --- | --- | --- | --- | --- |
| 20k | 3.80 ns | 1.40 ns | 2.60 ns | 700 uw |
| 1 ohm | 2.16 ns | 1.52 ns | 1.84 ns | 735 uw |

As can be seen from Table II, with the reduced value of the resistor R2 from 20k to 1 ohm there is an improvement of 40 percent on the falling edge transition (high-to-low propagation delay time $T_{p+-}$) and an improvement of 30 percent of the total average propagation delay time $T_{pav}$. There is a slight degradation on the rising edge transition (low-to-high propagation delay time $T_{p-+}$) due to the fact that the transistor Q3 will be conducting more current which produces a higher saturation voltage. This causes the transistor Q1 and Q2 to turn on slower which decreases slightly their current sourcing capability.

The receiver circuit sectin 24 includes a standard AFL gate driver circuit, similar to that of FIG. 1, with its output connected to its input. In particular, its input is on the base of a NPN-type bipolar transistor Q4, and its output is on the collector of the transistor Q4 which is tied back to its base. The collector of the transistor Q4 is connected also to the same supply potential $V_{CC}$ of the driver circuit section via a resistor R3. The emitter of the transistor Q4 is connected to the collector of a Schottky transistor Q5. One end of a resistor R4 is connected to the collector of a transistor Q4, and the other end of the resistor R4 is connected to the base of the transistor Q5. The emitter of the Schottky transistor Q5 is tied to the ground potential gnd. A Schottky barrier diode SD1 has its anode connected to the collector of the transistor Q4 and its cathode connected to the base of the transistor Q5.

The receiver circuit section further includes an output level-shifting bipolar transistor Q6 of the NPN-type. The transistor Q6 has its base connected to the base of the transistor Q4 and its collector connected to the supply potential $V_{CC}$ via a resistor R5 and to an output terminal 30. The collector of the transistor Q6 is connected to the anode of a Schottky diode SD2. An NPN-type bipolar transistor Q7 formed as a diode has its anode connected to the cathode of the Schottky diode SD2 and its cathode connected to the ground potential.

The emitter of the transistor Q6 is connected to the output node 28 of the driver circuit section 22.

As previously discussed above, when the input logic signal moves between the low and high voltage levels, the output voltage $V_{DR}$ of the driver circuit section will swing between $V_{DRL}=V_{CE(SAT)}$ and $V_{DRH}=V_{SD}$, respectively. Since the transistors Q4 and Q5, resistors R3 and R4 and diode SD1 are connected as a standard AFL gate circuit with its output connected to its input, a reference voltage will be provided to the base of the transistor Q6. This reference voltage will self-adjust to a stable center point approximately of $V_{BE}+V_{SD/2}$ which is obtained by adding AFL's high and low levels and dividing the same by 2. With $V_{DRL}=V_{CE(SAT)}$, the transistor Q6 will be turned on since:

$$V_{BE(Q6)} = V_{BE} + V_{SD/2} - V_{CE(SAT)}$$

Where $V_{CE(SAT)}$ is $\leq V_{SD/2}$.

Therefore, the output voltage $V_{OUT}=V_{OL}$ at the terminal 30 will be equal to:

$$V_{CE(SAT)Q6} + V_{CE(SAT)} \leq V_{BE} \qquad (1)$$

On the other hand, with $V_{DRH}=V_{SD}$, the base-to-emitter voltage of the transistor Q6 will be equal to $V_{BE}+V_{SD/2}-V_{SD}$ which is less than $V_{BE}$. Therefore, the transistor Q6 will be turned off and current will be flowing through the resistor R5, the diode SD2 and the transistor Q7. Consequently, the output voltage $V_{OUT}=V_{OH}$ at the terminal 30 will be equal to:

$$V_{BE}+V_{SD} \qquad (2).$$

From the equation (1) and (2), it can be seen that the respective low and high voltage levels $V_{DR}$ of the driver circuit section at the output node 28 are translated to the following voltage levels.

$$V_{OL} = 2V_{CE(SAT)} \leq V_{BE} \qquad \qquad 40$$

$$V_{OH} = V_{BE} + V_{SD}$$

Since the low voltage level $V_{OL}$ from the receiver circuit section at the output terminal 30 is lower than the standard AFL gate's down level of $V_{OL}=V_{BE}$, there will be an output voltage swing of a greater amplitude appearing at the output terminal 30 thereby causing a greater noise margin.

With $V_{CC}=2.0$ volts, $C_L=5.0$ pF, R1=10k and R2=1 ohm, a simulation yielding data of the corresponding propagation delay times is shown in Table III below for the various temperatures.

TABLE III

| Temperature | $T_{p+-}$ | $T_{p-+}$ | $T_{pav}$ | Power |
|---|---|---|---|---|
| 25° C. | 2.16 ns | 1.52 ns | 1.84 ns | 735 uw |
| 155° C. | 4.92 ns | 2.62 ns | 3.77 ns | 776 uw |
| −55° C. | 2.65 ns | 1.58 ns | 2.12 ns | 668 uw |

By comparison of Table III with Table I, it can be seen that the line driver circuit of the present invention formed of a driver circuit section and a receiver circuit section produces a 49 percent, 31 percent and 53 percent improvement in the average propagation delay time at the temperatures of 25° C., 155° C. and −55° C., respectively, over the standard AFL gate circuit with reduced resistor values.

From the foregoing detailed description, it can thus be seen that the present invention provides an improved AFL line driver circuit for driving large capacitive lines which exhibits a high speed of operation and has relatively low power dissipation. The line driver circuit is formed of a driver circuit section and a receiver circuit section. The driver circuit section includes a current source and a current sink which are adapted for charging and discharging quickly a capacitive load. The receiver section includes an output level-shifting transistor which is adapted for translating a voltage at an output node of the driver circuit section to a higher level.

While there has been illustrated and described what is at present to be considered a preferred embodiment of the present invention, it will be understood by those skilled in the art that various changes and modifications may be made, and equivalents may be substituted for elements thereof, without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out this invention, but that the invention will include all embodiments falling within the scope of the appended claims.

What is claimed is:

1. A line driver circuit adapted for driving large capacitive lines comprising:
   a driver circuit section including:
      a pair of first and second bipolar transistors being connected together and to an input terminal, the collector of said first transistor being connected to a supply potential via a first resistor and the collector of said second transistor being connected to the supply potential;
      a first Schottky transistor, the collector of said Schottky transistor being connected to the emitters of said first and second transistors and to an output node, the emitter of said Schottky transistor being connected to a ground potential;
      a second resistor having its one end connected to the collector of the first transistor and its other end connected to the base of said Schottky transistor: and
      a capacitive load being connected to the output node; and
   a receiver circuit section including:
      a third bipolar transistor, the collector of said third transistor being connected to the supply potential via a third resistor and to its base;
      a second Schottky transistor having the collector connected to the emitter of said third transistor and its emitter connected to the ground potential;
      a fourth resistor having its one end connected to the collector of said third transistor and its other end connected to the base of said second Schottky transistor;
      a first Schottky diode having its anode connected to the collector of said third transistor and its cathode connected to the base of said second Schottky transistor;
      a third Schottky transistor having its base connected to the base of said third transistor, its collector connected to the supply potential via a fifth resistor and to an output terminal, and its emitter connected to the output node of said driver circuit section;

a second Schottky diode having its anode connected to the output terminal; and a fourth bipolar transistor connected as a diode and having its anode connected to the cathode of said second Schottky diode and its cathode connected to a ground potential.

2. A line driver circuit as claimed in claim 1, wherein said first through fourth bipolar transistors are NPN-type.

3. A line driver circuit as claimed in claim 1, wherein an input logic signal is applied to said input terminal of said driver circuit section.

4. A line driver circuit as claimed in claim 3, wherein said input logic signal swings between a low voltage level of about $V_{BE}$ and a high voltage level of about $V_{BE}+V_{SD}$.

5. A line driver circuit as claimed in claim 4, wherein an output voltage at said output terminal of said receiver circuit section responsive to said input logic signal is translated to a low output level of about $2V_{CE(SAT)}$ and a high output level of about $V_{BE}+V_{SD}$.

6. A line driver circuit as claimed in claim 1, wherein said first through fourth bipolar transistors are of one conductivity type.

7. A line driver circuit as claimed in claim 6, wherein said first through fourth bipolar transistors are NPN-type.

8. A line driver circuit a claimed in claim 1, wherein said first and second bipolar transistors are of one conductivity type.

9. A line driver circuit as claimed in claim 8, wherein said first and second bipolar transistors are NPN-type.

10. A line driver circuit comprising:

a driver circuit section including:

current source means formed of a first bipolar transistor, said first transistor having its base coupled to an input terminal, its collector coupled to a supply potential via a first resistor, and its emitter coupled to a capacitive load and to an output node;

current sink means formed of a Schottky transistor, said Schottky transistor having its base coupled to said supply potential via said first resistor and a second resistor, its emitter coupled to a ground potential and its collector coupled to said capacitive load; and said current source means being adapted to charge up quickly said capacitive load and said current sink means being adapted to discharge quickly said capacitive load; and a receiver circuit section including:

output transistor means formed of a second bipolar transistor, said second transistor having its emitter coupled to said output node of said driver circuit section and having its collector coupled to an output terminal; and said output transistor means being adapted for translating a voltage at said output node of said driver circuit section to a higher level.

11. A line driver circuit as claimed in claim 10, wherein said first and second bipolar transistors are NPN-type.

12. A line driver circuit as claimed in claim 10, wherein an input logic signal is applied to said input terminal of said driver circuit section.

13. A line driver circuit as claimed in claim 12, wherein said input logic signal swings between a low voltage level of about $V_{BE}$ and a high voltage level of about $V_{BE}+V_{SD}$.

14. A line driver circuit as claimed in claim 13, wherein an output voltage on said output terminal of said receiver circuit section responsive to said logic input signal is translated to a low output level of about $2V_{CE(SAT)}$ and a high output level of about $V_{BE}+V_{SD}$.

15. A line driver circuit as claimed in claim 10, wherein said driver circuit section further includes a bipolar transistor having its base coupled to the base of said first bipolar transistor, its collector connected to the supply potential, and its emitter coupled to the emitter of said first bipolar transistor.

16. A line driver circuit as claimed in claim 10, wherein a series connected Schottky diode and bipolar transistor formed as a diode are coupled to said output terminal.

* * * * *